United States Patent [19]
Baker

[11] 4,336,452
[45] Jun. 22, 1982

[54] RADIATION DETECTOR CIRCUITS WHICH INHIBIT DEPOLING OF THE DETECTOR

[75] Inventor: Geoffrey Baker, Southampton, England

[73] Assignee: U.S. Philips Corporation, New York, N.Y.

[21] Appl. No.: 137,028

[22] Filed: Apr. 3, 1980

[30] Foreign Application Priority Data

Apr. 12, 1979 [GB] United Kingdom ............... 7912912

[51] Int. Cl.$^3$ ............................................... G01J 1/00
[52] U.S. Cl. .................................................. 250/338
[58] Field of Search ............... 250/338, 352; 307/308, 307/310, 311; 328/2, 3; 73/362 CP

[56] References Cited

U.S. PATENT DOCUMENTS

| | | | |
|---|---|---|---|
| 2,122,748 | 7/1938 | Mayer | 178/44 |
| 3,453,432 | 7/1969 | McHenry | 250/83.3 |
| 3,480,777 | 11/1969 | Astheimer | 250/83.3 |
| 3,539,803 | 11/1970 | Beerman | 250/83 |
| 3,581,092 | 5/1971 | Pearsall et al. | 250/83.3 |
| 3,631,434 | 12/1971 | Schwartz | 240/228 |
| 3,657,644 | 4/1972 | Beam et al. | 324/61 R |
| 3,772,518 | 11/1973 | Murayama et al. | 250/211 |
| 3,839,640 | 11/1974 | Rossin | 250/353 |
| 3,842,276 | 10/1974 | Southgate | 250/336 |
| 3,877,308 | 4/1975 | Taylor | 73/362 |
| 3,940,974 | 3/1976 | Taylor | 73/88.5 |
| 4,075,507 | 2/1978 | Pauli et al. | 307/117 |
| 4,198,564 | 4/1980 | Baker et al. | 250/338 |

FOREIGN PATENT DOCUMENTS

| | | |
|---|---|---|
| 1306330 | 2/1973 | United Kingdom . |
| 1384596 | 2/1975 | United Kingdom . |
| 1447372 | 6/1976 | United Kingdom . |
| 1464555 | 2/1977 | United Kingdom . |
| 1504283 | 3/1978 | United Kingdom . |

Primary Examiner—Alfred E. Smith
Assistant Examiner—Carolyn E. Fields
Attorney, Agent, or Firm—Marc D. Schechter

[57] ABSTRACT

In a pyroelectric detector circuit arrangement in which a pair of capacitive detector elements ($C_1$ and $C_2$) formed of polarized pyroelectric material are electrically connected in series with the directions of polarization of the elements being such that the normally produced signal voltages are in opposition, means are provided for inhibiting the depoling of the elements under conditions of cooling or excessive temperature cycling. These depoling inhibiting means comprise a pair of ultra-low leakage diode elements ($D_1$ and $D_2$) in series opposition connection and arranged in parallel connection with the capacitive detector elements. Connections are present between the common points in the diode series and the capacitive detector element series. The diode elements are arranged with respect to the directions of polarization of the detector elements so that under conditions of large decreases in temperature of the detector elements the voltages generated across the detector elements are effective to forward bias the diode elements into conduction and thereby inhibit depoling of the detector elements. The diode elements, under normal conditions of irradiation of the detector elements, present a high impedance path between the input of FET amplifier means and a point of constant potential.

In one embodiment the capacitive detectors ($C_1$ and $C_2$), the ultra-low leakage diode elements ($D_1$ and $D_2$), and FET amplifier means are present in a common envelope in the form of a hybrid microcircuit having only three external terminal connections.

13 Claims, 7 Drawing Figures

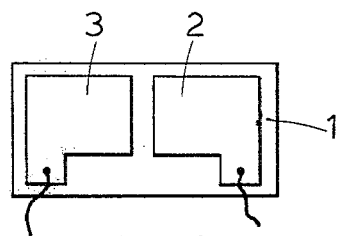
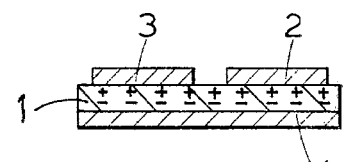
Fig. 1 PRIOR ART
Fig. 2 PRIOR ART
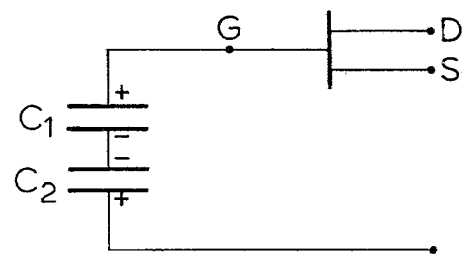
Fig. 3 PRIOR ART
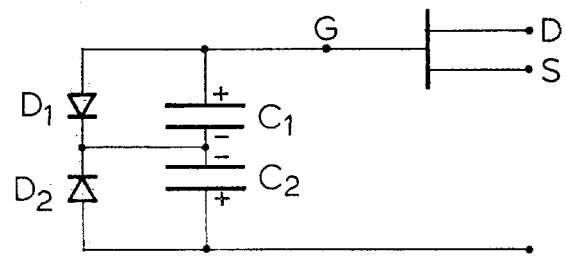
Fig. 4
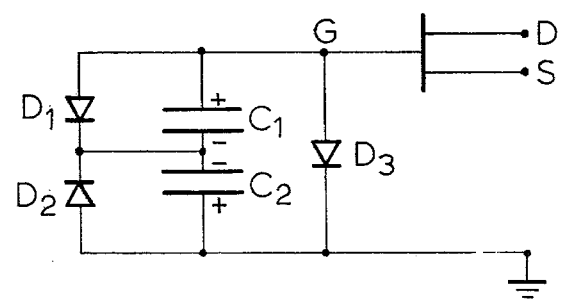
Fig. 5

RADIATION DETECTOR CIRCUITS WHICH INHIBIT DEPOLING OF THE DETECTOR

BACKGROUND OF THE INVENTION

This invention relates to pyroelectric radiation detector devices and circuit arrangements including a pyroelectric radiation detector device. More particularly, but not exclusively, the invention relates to such devices and circuit arrangements in which the detector device comprises a pair of detector elements formed of polarized pyroelectric material in which the elements have been polarized by subjecting the pyroelectric material of the elements to a high electric field at an elevated temperature.

The use of pyroelectric material for radiation detection, in particular infrared radiation detection, is well established. The pyroelectric effect is the change of the electrical polarization of a crystal due to a temperature change. The state of polarization is not generally observable because under equilibrium conditions it is compensated by the presence of free charge carriers that have reached the surface of the crystal by conduction through the crystal and from the outside. The magnitude of the polarization, and hence of the compensating charge, depends on the temperature. When the temperature is changed so that the supply of compensating charges is less than the variation in the polarizing charge, then the crystal surfaces acquire an observable charge. This effect is employed in detector devices by making a body of pyroelectric material into a capacitor with electrodes on oppositely located plane surfaces which are perpendicular to the direction of polarization of the material. The redistribution of the compensating charges causes a current to flow in an external circuit to which the detector is connected.

For use in the detection of infrared radiation, for example for use in intruder detection equipment, various pyroelectric materials have been employed. These include materials such as triglycine sulphate, modified lead zirconate titanate, lithium tantalate and certain plastic film materials such as polyvinylidene fluoride. Polarization is normally achieved in such materials by applying an electric field in the direction of the polar axis, sometimes while simultaneously subjecting the material to an elevated temperature, so as to align the electric dipoles. In some materials, for example L-alanine doped triglycine sulphate, it is not necessary to induce the polarization by application of an electric field as full polarization already exists in the material.

For use in intruder detection equipment it is possible to employ a detector device comprising a single detector element of pyroelectric material and various detector devices are commercially available for this purpose. One such detector device is described in United Kingdom patent application No. 16110/77, corresponding to U.S. Pat. No. 4,198,564. However it has also been found that for the purpose of detecting small movements across the total field of view of the detector device an increased sensitivity can be obtained when the detector device comprises more than one detector element. In this configuration the device can be constructed so that uniform changes in input radiation in the fields of view of all the elements, for example changes in background radiation, will produce voltages across pairs of elements which are in opposition and therefore no net signal voltage is created. On the other hand, a change in input radiation in the field of view of one element but not in the field of view of another element can produce a differential output signal.

One such known radiation detector device comprises a pair of detector elements arranged in a common plane. Each element is formed of a body or body part of polarized pyroelectric material. The elements each have electrodes on opposite major surfaces in overlapping relationship and the electrodes extend substantially normal to the direction of polarization of the pyroelectric material. The elements are electrically connected within the devie via their electrodes to form two series-connected capacitive detectors in which the directions of polarization of the pyroelectric materials are in opposition.

Hereinafter, any reference to the directions of polarization of the elements being in opposition is to be understood to mean that in the series connection the signal polarities produced by the individual elements under irradiation are in opposition for a common radiation input.

In such a device the structure may be obtained using a single body of pyroelectric material having first and second main electrodes on one major surface and a common electrode on the opposite major surface of the body, the common electrode being in overlapping relationship with both of the first and second main electrodes. In the normal detector operation no electrical terminal connection is made to the common electrode, the first and second main electrodes each having a terminal connection. It is of course alternatively possible to modify the structure and employ separate bodies with an appropriate common connection between the two elements to give the desired series connection of the two capacitive detectors.

Detector devices comprising two pyroelectric elements connected in series may be referred to as "Dual" detectors. The operation of a "Dual" detector, the directions of polarization of the two elements are in opposition, is based on the principle that where there is the same temperature change in both elements due to the same radiation change in the fields of view of both elements, due to their differential electrical connection the voltages generated across the capacitive detectors will cancel. When, however, the change in temperature of one element, as determined by the change in radiation in the field of view of the one element, is not accompanied by a corresponding change in temperature of the other element, as determined by the change in radiation in the field of view of the other element, a differential signal voltage is created. It has been found that the use of such "Dual" detectors is highly suitable in intruder detector systems. One important advantage is that fluctuations in the thermal state of the background scene produce no output signal from the detector. In single element detectors such fluctuations produce a noise-like signal, sometimes referred to as environmental noise. This noise is substantially reduced in the alarm circuitry of "Dual" detectors, thereby giving a greater range of detection. Alternatively, the range can be kept the same with the result that the probability of a false alarm is substantially reduced. Clearly a compromise between these two extremes can be chosen if desired.

A further advantage lies in the fact that a change in the temperature of the dual element detector due to an ambient temperature change will result in a much lower change in output compared with the change that would occur with a single element detector. The level of such a change in output of a dual detector depends on the degree of matching of the two elements. Hence the dual detector is more tolerant of changes of environmental temperature within the alarm circuit enclosure.

A known circuit arrangement including a "Dual" detector includes signal amplifying means, for example field effect transistor (FET) amplifier means. The input circuit of the FET amplifier means including the series connected capacitive detector elements.

When using certain ceramic pyroelectric materials, for example modified lead zirconate titanate, in the "Dual" detectors, the pyroelectric material is polarized by subjecting the material, normally after defining the elements therein, to a high electrical field at an elevated temperature. Certain problems may arise with these detectors in operation insofar as their ability to withstand temperature variations over a wide range is concerned. One difficulty involved when subjecting the elements to wide temperature variations, for example from −40° C. to +100° C. is that in certain pyroelectric materials the polarization may be diminished even after a few of such temperature excursions. This depoling property is to a certain extent related to the choice of material. The temperature variation induced depoling effect is greater when the maximum temperatures concerned are nearer the Curie point of the material. Thus for a material such as lithium tantalate, where the Curie point is approximately 600° C., the effect is potentially less troublesome than with a material such as modified lead zirconate titanate where the Curie point may be 100° C. or lower. However, for other technological reasons it is undesirable that the choice of the pyroelectric material for the detector elements should be determined by the ability of the material to withstand wide temperature variations without depoling.

SUMMARY OF THE INVENTION

It is an object of the invention to provide a circuit arrangement including a pyroelectric radiation detector device having a pair of detector elements, and to provide a pyroelectric radiation detector device having a pair of detector elements where the depoling of the detector elements by wide temperature variations is at least partly mitigated.

According to a first aspect of the invention there is provided a circuit arrangement comprising a pyroelectric radiation detector device having a pair of detector elements each formed of a body or body part of polarized pyroelectric material. The elements each have electrodes on opposite major surfaces and the electrodes extend substantially normal to the direction of polarization of the pyroelectric material. The detector elements are electrically connected in series to form two series connected capacitive detectors. In the series connection the directions of polarization of the pyroelectric materials are in opposition. In order to inhibit the depoling of the detector elements, the circuit arrangement further comprises two ultra-low leakage diodes connected in series opposition. The diodes are connected in parallel with the detector elements. An electrical connection is also present between the common point in the series connection of the diodes and the common point in the series circuit connection of the capacitive detector elements. The polarities of the diodes with respect to the directions of polarization of the elements are arranged so that for an increase in incident radiation on one or both detector elements the potential developed across the irradiated element or elements is in a sense such as to reverse bias the corresponding diode element connected in parallel therwith.

In such an arrangement the diodes limit the voltage excursion of the common point, in the series circuit connection of the capacitive detector elements, in a direction opposing the polarization of the elements. The discovery underlying the provision of the diodes is that when uniformly heating the two elements the voltages generated across the two elements not only will cancel out but will also increase the polarization. On the other hand, when uniformly cooling the two elements the voltages generated will be in the opposite direction, tending to oppose the induced or inherent polarization of the elements. Thus, when heating, although the voltage at the common point in the series circuit connection of the capacitive detector elements will be high, this voltage is not undesirable because it aids the polarization. However when the element is cooled the opposite effect occurs and the voltage which, in the absence of the diodes, is developed at the common point in the series connection of the capacitive detector elements opposes the induced or inherent polarization and therefore tends to depole the elements.

The circuit arrangement according to the invention is based on the further discovery that by the provision of ultra-low leakage diodes connected in series opposition, in the normal operation of the device the diodes will constitute a high impedance so that substantially no excess noise will be generated.

In one form of the circuit arrangement according to the invention, the circuit arrangement also includes field effect transistor amplifier means. In this circuit the series connected capacitive detector elements are connected in parallel with the series connected diodes in the gate electrode circuit of the field effect transistor amplifier means.

In one such arrangement the opposite ends of the series connection of the capacitive detector elements form, respectively, a first main electrode and a second main electrode. The first main electrode is connected to the gate electrode of the field effect transistor amplifier means and the second main electrode is connected to a point of constant potential. At least one high impedance device is connected between the gate electrode and the point of constant potential in order to stabilize the working point of the field effect transistor amplifier means. The high impedance device may be a single ultra-low leakage diode with its anode connected to the gate of the FET (n-channel) so as to allow the gate leakage current to flow to the point of constant potential. For a p-channel FET the cathode of the diode is connected to the gate of the FET, and its anode is connected to the point of constant potential. Alternatively, a pair of such diodes may be connected in parallel and in opposite polarity between the FET gate and the point of constant potential. As a further alternative, a high value resistor may be used, the value of which must be sufficiently high so as not to generate excess noise, for example a value of at least $10^{10}$ ohms.

According to a further aspect of the invention a pyroelectric radiation detector comprises an envelope and a pair of pyroelectric detector elements located within the envelope in such manner to receive radiation to be detected. The elements are each formed of a body or body part of polarized pyroelectric material. The elements each have electrodes on opposite major surfaces and the electrodes extend substantially normal to the direction of polarization of the pyroelectric material. The electrical connections of the elements, via their electrodes, form two series connected capacitive detectors in which the directions of polarization of the pyroelectric material are in opposition. In order to inhibit the depoling of the detector elements two ultra-low leakage diodes are also provided within the envelope. The diodes are connected in series opposition and in parallel with the series connection of the capacitive detectors. An electrical connection is also present between the common point in the series circuit connection of the diodes and the common point in the series circuit connection of the capacitive detector elements. The polarities of the diodes are arranged so that for an increase in incident radiation on one or both detector elements the potential developed across the irradiated element or elements is in a sense such as to reverse bias the corresponding diode connected in parallel therewith.

It is found that such a device according to the first aspect of the invention can be embodied, if desired, in a simple manner in the form of a hybrid microcircuit. The device may include within the envelope further circuit components as may be desired.

In one form the two detector elements are formed in a common body of pyroelectric material. First and second main electrodes are present on one major surface of the body and a common electrode is present on the opposite major surface of the body. The common electrode overlaps the first and second main electrodes. Means for connecting the first main electrode to signal amplifying means and means for connecting the second main electrode to a point of constant potential are also provided. The two diodes are mounted on a common conductive surface with electrodes of one polarity connected by the common conductive surface. A conductive connection is present between the common conductive surface and the common electrode on the body of pyroelectric material. The opposite polrity electrode of one of the diodes is connected to the first main electrode on the body of pyroelectric material and the opposite polarity electrode of the other diode is connected to the point of constant potential.

In a further development of such a device, a field effect transistor (FET) is present within the envelope. The gate electrode of the FET is connected to the first main electrode on the body of pyroelectric material. The source and drain electrodes of the FET are connected, respectively, to first and second terminal connections extending from the envelope. The second main electrode on the body of pyroelectric material and the opposite polarity electrode of the other diode are connected to a third terminal connection extending from the envelope. In this form the detector device may be embodied as a simple three terminal device with the FET amplifier means included with the detector elements and depoling-inhibiting diodes in the one envelope.

In a further modification, at least one further ultra-low leakage diode is connected between the FET gate electrode and the third terminal connection. This serves to stabilize the operating point of the FET. In another form a pair of ultra-low leakage diodes are connected in parallel and in opposite polarity between the FET gate electrode and the third terminal connection.

A preferred material for use in the detector according to the second aspect of the invention is lanthanum and manganese doped lead zirconate titanate. A detailed description of the composition ranges of such a material is disclosed in U.K. Pat. No. 1,504,283. Reference herein to modified lead zirconate titanate is to be understood to include compositions such as are described and claimed in this United Kingdom Patent Specification.

Embodiments of the invention will now be described, by way of example, with reference to the accompanying drawings.

BRIEF DESCRIPTION OF THE DRAWING

FIG. 1 is a plan view of part of a prior art pyroelectric radiation detector device.

FIG. 2 is a cross-section through a portion of the prior art device shown in FIG. 1.

FIG. 3 is a circuit diagram of an arrangement including the prior art detector device shown in FIGS. 1 and 2.

FIG. 4 is a circuit diagram of a circuit arrangement according to the first aspect of the invention.

FIG. 5 is a circuit diagram of another circuit arrangement according to the first aspect of the invention.

DESCRIPTION OF THE PREFERRED EMBODIMENTS

Figure 6:
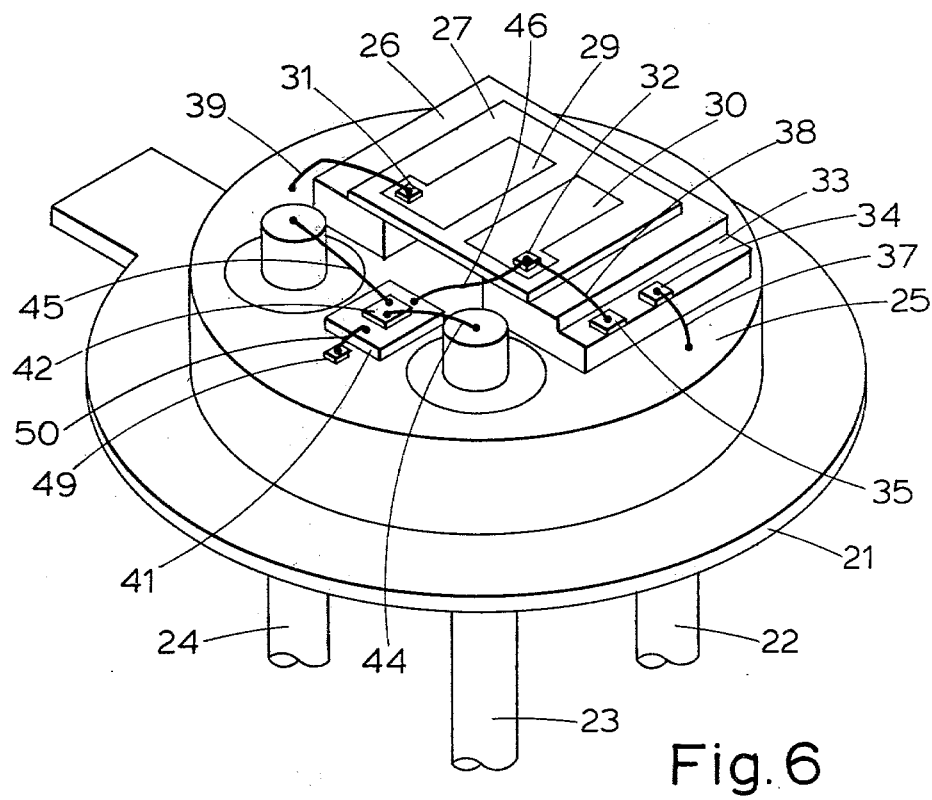
FIG. 6 is a perspective view of a pyroelectric radiation detector device according to the second aspect of the invention and having a circuit configuration according to the circuit arrangement shown in FIG. 5.

Referring now to FIGS. 1 and 2, there is shown a prior art pyroelectric radiation detector device comprising a body 1 of ceramic pyroelectric material, for example of modified lead zirconate titanate, of approximately 3.5 mm × 3.0 mm × 50 micron thickness. On one major surface of the body there are a pair of nichrome electrodes 2 and 3 which can be penetrated by infrared radiation of a wavelength at which the device is responsive. On the opposite major surface there is a common electrode 4 consisting of nichrome. During manufacture of the device, at a stage subsequent to the application of the electrodes to the body of pyroelectric material, a high field has been applied across the body, the electrodes 2 and 3 being connected in common for this purpose. This high field, in the region of 2 kV/mm. has been applied for a period of 10 minutes while heating the body 1 at 130° C. The field has been maintained during the subsequent cooling of the body to room temperature. This treatment polarizes the material of the body 1 in a direction normal to the main surfaces of the body 1 on which the electrodes are present. FIG. 2 indicates the polarity of the polarization of the material after this treatment.

The circuit connection of the device shown in FIGS. 1 and 2 is such that in operation only terminal connections are made only to the electrodes 2 and 3. Thus, between these terminal connections the device is effectively two series connected capacitive detectors 2, 4 ($C_1$) and 3, 4 ($C_2$), in which the directions of polarization are in opposition. That is, in terms of the capacitive detectors the normal signal voltages produced across the two elements will be in opposition for a common radiation input.

FIG. 3 shows a known circuit arrangement comprising a device as shown in FIGS. 1 and 2. The two series connected capacitive detectors 2, 4 and 3, 4 are indicated by references $C_1$ and $C_2$. The polarization of each detector is indicated by positive and negative signs adjacent the electrodes at opposite sides of each detector. In the circuit arrangement, the electrode 2 of $C_1$ is connected to the gate of a field effect transistor (FET) and the electrode 3 of $C_2$ is connected to a point of reference potential. In one such known arrangement the FET is incorporated in the same envelope as the detector device $C_1$, $C_2$ and the resulting arrangement has only three terminals.

If one now considers the effect of subjecting the body 1 to an elevated temperature so that capacitive detectors $C_1$ and $C_2$ are uniformly affected, then this will have the effect of generating voltages across the capacitive detectors $C_1$ and $C_2$ which tend to increase the polarization. Thus, the back electrode 4 becomes more positive and the front electrodes 2 and 3 become more negative. Since the temperature of both elements changes the same amount, the voltages generated in the series connected circuit will be in opposition and will therefore cancel out. It should be noted, however, that the floating back electrode may assume quite a high potential.

When following this heating the body 1 is cooled, the opposite effect occurs. Thus, the voltages generated across the capacitance detectors are opposite to the polarizing field. Thus, if on cooling, the back electrode 4 becomes more negative relative to the electrodes 2 and 3 then a depoling of the pyroelectric material may occur. Depoling is even more likely if only cooling takes place, since with stable thermal conditions any charge on the back electrode 4 will have leaked away with time prior to cooling, and on cooling a depoling voltage will appear which will get larger as the temperature fall is increased.

It has been found that for a device made of modified lead zirconate titanate material and having a configuration as shown in FIGS. 1 and 2, when subjecting the body 1 to temperature fluctuations of from $-40°$ C. to $+100°$ C. the pre-induced poling of the element is severely degraded after several of such temperature excursions.

Referring now to FIG. 4, this circuit arrangement according to the first aspect of the invention corresponds to the circuit shown in FIG. 3 with the addition of two ultra-low leakage diodes $D_1$ and $D_2$ connected in series opposition and in parallel with the capacitive detector elements $C_1$ and $C_2$. There is also a further connection between the common point between $C_1$ and $C_2$ and the common point between $D_1$ and $D_2$. The diodes are connected in such a sense with respect to the directions of polarization of the detector elements that for an increase in incident radiation on one or both detector elements, the potential developed across the irradiated element or elements is in a sense as to reverse bias the corresponding diode element connected in parallel therewith. Thus, in the arrangement shown the anodes of the diodes are connected to the negatively polarized sides of the detector elements. The operation of this circuit is such that in normal operating conditions the series connected diodes $D_1$ and $D_2$ present a high impedance between the FET gate and the point of constant potential so that their presence does not constitute a source of increased noise. However, under the adverse temperature cycling conditions described and upon the cooling of the pyroelectric elements, the negative excursion at the common electrode relative to the electrodes at the opposite side of the elements is limited by virtue of both $D_1$ and $D_2$ being brought into a state of forward conduction. By suitable choice of the diode parameters this negative excursion may be limited, for example to a few hundred millivolts which is insufficient to bring about depoling of the previously poled elements.

The circuit arrangement shown in FIG. 4 can be embodied in a simple manner using a structure of the form shown in FIGS. 1 and 2, making an additional connection to the back electrode 4, and including diode elements $D_1$ and $D_2$. Such an arrangement may be present, in part, in the form of a two-terminal hybrid microcircuit including the detector elements $C_1$ and $C_2$ and the diode elements $D_1$ and $D_2$. This circuit is connected, in operation, to the FET. However it may be more convenient to include within the hybrid microcircuit the FET and thus form a three terminal device.

FIG. 5 shows a modified form of the circuit arrangement shown in FIG. 4. It differs only in that between the gate of the FET (n-channel in this example) and the point of constant potential there is included a further ultra-low leakage diode $D_3$ in order to allow the gate leakage current to flow and hence stabilize the working point of the FET.

FIG. 6 shows a radiation detector device according to the second aspect of the invention and in the form of a hybrid microcircuit having a circuit configuration of the form shown in FIG. 5. The device comprises an envelope having a three lead header 21 of TO-5 configuration as commonly used in the semiconductor art in which a lead 22 is connected to the main metal part of the header and leads 23 and 24 extend as posts through said metal part and are insulated therefrom by metal-to-glass seals. The metal part of the header is gold-plated and on the upper surface 25 of the metal header there is a U-shaped plinth member 26 of approximately 1 mm thickness and consisting of high density alumina material having a gold coated upper surface. The plinth member forms a support for a pyroelectric element 27 of modified lead zirconate titanate having a thickness of approximately 50 microns and major surfaces of approximately 3.0 mm$\times$3.5 mm. On the lower surface of the element 27 there is a nichrome electrode which forms an electrical connection to the gold coating on the plinth 26 by means of an intermediate layer of a conducting epoxy material. On the upper surface of the element 27 there are two nichrome electrodes 29 and 30 of generally rectangular configuration. The electrodes 29 and 30 have enlarged area portions on which elements 31 and 32 respectively, each of gold foil of 0.4 mm$\times$0.4 mm, are mounted with a conducting epoxy layer.

The plinth member on one limb has a recessed surface 33. The gold coating present on the upper surface of the plinth member 26 also extends to the surface 33 and thus a conductive path is formed between these surfaces. On the surface 33 there are secured diodes 34 and 35 with their cathodes making contact with the gold plating via silver epoxy layers. The anode of diode element 34 is connected to the gold plated header surface 25 by means of a bonded wire 37 and the anode of diode element 35 is connected to the gold foil element 32 on the electrode 30 by means of a wire 38. The gold foil element 31 on the electrode 29 is connected to the gold plated header surface 25 by a wire 39.

The diodes 34 and 35 are unencapsulated chips and correspond to those normally used in Mullard type BAV 45 which is a very low leakage picoampere diode. These diode chips form the diodes $D_1$ and $D_2$ respectively in FIG. 5.

Situated between the two posts 23 and 24 where they extend above the surface 25 there is an alumina support member 41 of 2.0 mm×2.0 mm×0.25 mm having on its upper surface a conductive coating of gold. On the coated upper surface of the member 41 there is secured by means of a conducting epoxy layer an n-channel junction field effect transistor (JFET) 42 in the form of an unencapsulated chip. In the chip the semiconductor substrate forms part of the gate electrode and at the upper surface there are source and drain bonding pads. The source and drain pads are connected by bonded wires 44 and 45, respectively, to the top surfaces of the posts 23 and 24. A further connection between the conductive surface of the member 41 and the gold foil element 32 on the electrode 30 is formed by a wire 46. In the circuit shown in FIG. 5 this forms the connection between the gate G and the outer plate of $C_1$.

Adjacent the ceramic member 41 on the surface 25 there is present a further diode 49 which is secured via its cathode to the surface 25 with a conductive epoxy layer. The anode of the diode 49 is connected to the conductive surface on the ceramic member 41 by a wire 50. In this embodiment the diode 49, which corresponds to $D_3$ in FIG. 5, is also formed by an unencapsulated Mullard BAV 45 chip.

In the device shown all the wire connections are formed by gold wires of 25 micron diameter and they are all secured to the various electrodes and surfaces by ultrasonic bonds.

The pyroelectric radiation detector device shown in FIG. 6, in the form of a three-terminal hybrid microcircuit may be employed effectively in intruder detector systems. The device is completed by a cover member (not shown) secured to the rim of the TO-5 header. The cover member has a window of multi-layer coated silicon which transmits infrared radiation in a wavelength range of 6.5 microns to 14 microns.

For further information on the circuit connection of the detector device reference can be made to the above-mentioned U.S. Pat. No. 4,198,564. The JFET within the device normally constitutes the input of amplifier means in which the high impedance on the input side is converted to a conventionally low output impedance. The provision of the depoling inhibiting diodes enables the device to withstand considerable temperature cycling and also rapid cooling without degradation of the performance due to depoling of the pyroelectric element.

In the manufacture of the particular detector shown, the element has been poled by subjecting the pyroelectric body 27, following application of the electrodes thereto, to a field of approximately 2 kV/mm, the field being maintained while cooling the body. It is to be noted that in the temperature cycling referred to, or under adverse operational conditions, the field strength to which the body is subjected on cooling may be comparatively high. The voltage at the electrode 28, in the absence of the depoling inhibiting diodes, may possibly rise to 10 volts or in extreme cases up to 100 volts.

Figure 7:
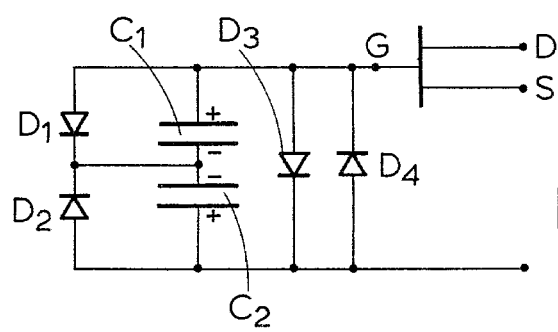
FIG. 7 is a circuit diagram of another circuit arrangement according to the first aspect of the invention.

FIG. 7 shows a further circuit arrangement according to the invention and consisting of a modification of the arrangement shown in FIG. 5. In this modified arrangement a further diode $D_4$, having the same characteristics as diode $D_3$, is connected between the FET gate and the point of constant potential. It is found that the presence of the two diodes $D_3$ and $D_4$, in reverse parallel connection, further enhances the stability of the operating point of the FET.

It will be appreciated that many modifications are possible within the scope of this invention. In particular, the structure shown in FIG. 6 may be suitably modified when the initial polarizing field applied to the element 26 is such that the upper surface is positive and the lower surface is negative. In such a device the polarity of the depoling inhibiting diode connections has to be reversed. Different circuit means may be employed for setting the operating point of the FET element, for example a high value resistor may be present between the FET gate and the common electrode terminal 22.

In some other circuit arrangements according to the invention the depoling inhibiting diodes may be formed by Schottky diodes.

Although the embodiments of the circuit arrangement and detector device have been described in terms of a single pair of detector elements in which the structure and electrode connections are arranged to form two series connected capacitive detectors in which the directions of polarization are in opposition, the invention may also be applied when using a greater number of such pairs detectors. For example, such detectors are described in U.S. Pat. No. 3,842,276. In the application of the invention to such a detector, in general there will be a plurality of series connected ultra-low leakage diodes corresponding in number with and connected in parallel with the series connected detector elements.

Although the embodiments of the invention have been described in terms of inhibiting the depoling of pairs of detector elements formed of a ceramic pyroelectric material, such as modified lead zirconate titanate, in which the polarization is induced by application of a high field, the invention may also be employed where the elements are formed of materials having an inherent polarization which is subject to depoling under the adverse conditions described.

I claim:

1. An electrical circuit arrangement comprising a pair of first and second detector elements formed of electrically polarized material, each of said elements having opposite first and second surfaces extending transverse to the direction of polarization, each of said first and second surfaces being provided with first and second electrodes, respectively, said detector elements being electrically connected in series by their first electrodes such that their directions of polarization are opposite each other;

characterized in that the circuit further comprises first and second diodes, the first diode electrically connected in parallel across one detector element and the second diode electrically connected in parallel across the other detector element, the polarities of the diodes being chosen such that for a decrease in the polarization of either one or both of the detector elements, the potential developed across said element will reverse bias the diode connected in parallel therewith.

2. An electrical circuit arrangement as claimed in claim 1, characterized in that the first and second surfaces extend substantially normal to the direction of polarization of the detector elements.

3. An electrical circuit arrangement as claimed in claim 2, characterized in that the diodes are ultra-low leakage diodes.

4. An electrical circuit arrangement as claimed in claim 3, characterized in that the detector elements are made of pyroelectric material.

5. An electrical circuit arrangement as claimed in claim 4, characterized in that the circuit further comprises a field effect transistor amplifier having a gate electrode, the gate electrode being electrically connected to the second electrode of the first detector element.

6. An electrical circuit arrangement as claimed in claim 5, characterized in that the circuit further comprises:
a source of constant potential, electrically connected to the second electrode of the second detector element; and
a high impedance device electrically connected between the gate electrode and the second electrode of the second detector element.

7. An electrical circuit arrangement as claimed in claim 6, characterized in that the pyroelectric material is lead zirconate titanate doped with lanthanum and manganese.

8. A radiation detector comprising:
an envelope;
a pair of first and second detector elements formed of electrically polarized material, each of said elements having opposite first and second surfaces extending transverse to the direction of polarization, each of said first and second surfaces being provided with first and second electrodes, respectively, said detector elements being electrically connected in series by the first electrodes such that their directions of polarization are opposite each other, said detectors being arranged in the envelope to receive radiation to be detected;
characterized in that the circuit further comprises first and second diodes, the first diode electrically connected in parallel across one detector element and the second diode electrically connected in parallel across the other detector element, the polarities of the diodes being chosen such that for a decrease in the polarization of either one or both of the detector elements, the potential developed across said element will reverse bias the diode connected in parallel therewith.

9. A radiation detector as claimed in claim 8, characterized in that the first and second surfaces extend substantially normal to the direction of polarization of the detector elements.

10. A radiation detector as claimed in claim 9, characterized in that the diodes are ultra-low leakage diodes.

11. A radiation detector as claimed in claim 10, characterized in that the detector elements are made of pyroelectric material.

12. A radiation detector as claimed in claim 11, characterized in that the two detector elements are formed of one body of pyroelectric material, said body having two surfaces substantially normal to the direction of polarization, the second electrodes being provided on one surface, the first electrodes being provided on the other surface as a single electrode opposite to the two second electrodes.

13. A radiation detector as claimed in claim 12, characterized in that the pyroelectric material is lead zirconate titanate doped with lanthanum and manganese.

* * * * *